(12) United States Patent
Tsang

(10) Patent No.: US 6,940,749 B2
(45) Date of Patent: Sep. 6, 2005

(54) MRAM ARRAY WITH SEGMENTED WORD AND BIT LINES

(75) Inventor: David Tsang, Cupertino, CA (US)

(73) Assignee: Applied Spintronics Technology, Inc., Milpitas, CA (US)

( * ) Notice: Subject to any disclaimer, the term of this patent is extended or adjusted under 35 U.S.C. 154(b) by 25 days.

(21) Appl. No.: 10/669,481

(22) Filed: Sep. 23, 2003

(65) Prior Publication Data

US 2004/0165424 A1 Aug. 26, 2004

Related U.S. Application Data

(60) Provisional application No. 60/448,886, filed on Feb. 24, 2003.

(51) Int. Cl.[7] ............................................... G11C 11/14
(52) U.S. Cl. ....................................... 365/171; 365/173
(58) Field of Search ................................ 365/171, 173, 365/158, 145

(56) References Cited

U.S. PATENT DOCUMENTS

| | | | |
|---|---|---|---|
| 5,659,499 A | 8/1997 | Chen et al. | |
| 5,940,319 A | 8/1999 | Durlam et al. | |
| 6,153,443 A | 11/2000 | Durlam et al. | |
| 6,211,090 B1 | 4/2001 | Durlam et al. | |
| 6,335,890 B1 | 1/2002 | Reohr et al. | |
| 6,678,187 B2 * | 1/2004 | Sugibayashi et al. | 365/158 |
| 2002/0034117 A1 | 3/2002 | Okazawa | |
| 2002/0080643 A1 | 6/2002 | Ito | |
| 2002/0127743 A1 | 9/2002 | Nickel et al. | |
| 2002/0176272 A1 | 11/2002 | DeBrosse et al. | |
| 2004/0174728 A1 * | 9/2004 | Takano et al. | 365/145 |

* cited by examiner

*Primary Examiner*—Anh Phung
(74) *Attorney, Agent, or Firm*—Sawyer Law Group LLP

(57) ABSTRACT

A method and system for providing and using a magnetic random access memory (MRAM) array are disclosed. The method and system include providing magnetic storage cells, global word lines and global word line segments, of global bit lines and bit line segments, and selection devices. Each word line segment is coupled with at least one global word line such that the word line segments are selectable. Each word line segment is also coupled to a portion of the magnetic storage cells. Each bit line segment is coupled with at least one global bit line such the bit line segments are selectable. Each bit line segment resides in proximity to and is used to write to a portion of the magnetic storage cells. The bit line segments and the word line segments are coupled with and selectable using the plurality of selection devices.

18 Claims, 9 Drawing Sheets

MRAM ARRAY WITH SEGMENTED WORD AND BIT LINES

CROSS-REFERENCE TO RELATED APPLICATIONS

This application is claiming under 35 USC 119(e) the benefit of provisional patent application Ser. No. 60/448,886 filed on Feb. 24, 2003.

The present application is related to co-pending U.S. patent application, Ser. No. 10/459,133, entitled "MRAM MEMORIES UTILIZING MAGNETIC WRITE LINES", filed on Jun. 11, 2003, which claims priority to Ser. No. 60/431,742 filed Dec. 9, 2002, and assigned to the assignee of the present application. The present application is related to U.S. patent application, Ser. No. 10/646,455 entitled "MRAM ARRAY WITH MAGNETIC WRITE LINES", filed on Aug. 21, 2003, now issued as U.S. Pat. No. 6,870,759 on Mar. 22, 2005, and assigned to the assignee of the present application.

FIELD OF THE INVENTION

The present invention pertains to magnetic memories, and more particularly to a method and system for providing a magnetic random access memory (MRAM) that is preferably high density, nonvolatile and that has an architecture incorporating magnetic write lines.

BACKGROUND OF THE INVENTION

Recently, a renewed interest in thin-film magnetic random access memories (MRAM) has been sparked by the potential application of MRAM to both nonvolatile and volatile memories. FIG. 1 depicts a portion of a conventional MRAM 1. The conventional MRAM includes conventional orthogonal conductor lines 10 and 12, conventional magnetic storage cell 11 and conventional transistor 13. The conventional MRAM 1 utilizes a conventional magnetic tunneling junction (MTJ) stack 11 as a memory cell. Use of a conventional MTJ stack 11 makes it possible to design an MRAM cell with high integration density, high speed, low read power, and soft error rate (SER) immunity. The conductive lines 10 and 12 are used for writing data into the magnetic storage device 11. The MTJ stack 11 is located on the intersection of and between 10 and 12. Conventional conductive line 10 and line 12 are referred to as the conventional word line 10 and the conventional bit line 12, respectively. The names, however, are interchangeable. Other names, such as row line, column line, digit line, and data line, may also be used.

The conventional MTJ 11 stack primarily includes the free layer 1104 with the changeable magnetic vector (not explicitly shown), the pinned layer 1102 with the fixed magnetic vector (not explicitly shown), and the insulator 1103 in between the two magnetic layers 1104 and 1102. The insulator 1103 typically has a thickness that is low enough to allow tunneling of charge carriers between the magnetic layers 1102 and 1104. Layer 1101 is usually a composite of seed layers and an anti-ferromagnetic layer that is strongly coupled to the pinned magnetic layer.

Data is stored in the conventional MTJ stack 11 by applying a magnetic field to the conventional MTJ stack 11. The applied magnetic field has a direction chosen to move the changeable magnetic vector of the free layer 1104 to a selected orientation. During writing, the electrical current $I_1$ flowing in the conventional bit line 12 and $I_2$ flowing in the conventional word line 10 yield two magnetic fields on the free layer 1104. In response to the magnetic fields generated by the currents $I_1$ and $I_2$, the magnetic vector in free layer 1104 is oriented in a particular, stable direction. This direction depends on the direction and amplitude of $I_1$ and $I_2$ and the properties and shape of the free layer 1104. Generally, writing a zero (0) requires the direction of either $I_1$ or $I_2$ to be different than when writing a one (1). Typically, the aligned orientation can be designated a logic 1 or 0, while the misaligned orientation is the opposite, i.e., a logic 0 or 1, respectively.

Stored data is read or sensed by passing a current through the conventional MTJ cell from one magnetic layer to the other. During reading, the conventional transistor 13 is turned on and a small tunneling current flows through the conventional MTJ cell. The amount of the current flowing through the conventional MTJ cell 11 or the voltage drop across the conventional MTJ cell 11 is measured to determine the state of the memory cell. In some designs, the conventional transistor 13 is replaced by a diode, or completely omitted, with the conventional MTJ cell 11 in direct contact with the conventional word line 10.

Although the above conventional MTJ cell 11 can be written using the conventional word line 10 and conventional bit line 12, one of ordinary skill in the art will readily recognize that the amplitude of $I_1$ or $I_2$ is in the order of several milli-Amperes for most designs. Therefore, one of ordinary skill in the art will also recognize that a smaller writing current is desired for many memory applications.

FIG. 2 depicts a portion of a conventional magnetic memory 1' that has a lower writing current. Similar systems are described in U.S. Pat. Nos. 5,659,499, 5,940,319, 6,211,090, 6,153,443, and U.S. Patent Application Publication No. 2002/0127743. The conventional systems and conventional methods for fabricating the conventional systems disclosed in these references encapsulate bit lines and word lines with soft magnetic cladding layer on the three surfaces not facing MTJ cell 11'. Many of the portions of the conventional memory depicted in FIG. 2 are analogous to those depicted in FIG. 1 and are thus labeled similarly. The system depicted in FIG. 2 includes the conventional MTJ cell 11', conventional word line 10' and bit line 12'. The conventional word line 10' is composed of two parts: a copper core 1001 and a soft magnetic cladding layer 1002. Similarly, the conventional bit line 12' is composed of two parts: a copper core 1201 and a soft magnetic cladding layer 1202.

Relative to the design in FIG. 1, the soft magnetic cladding layers 1002 and 1202 can concentrate the magnetic flux associated with $I_1$ and $I_2$ onto the MTJ cell 11' and reduce the magnetic field on the surfaces which are not facing the MTJ cell 11'. Thus, the sot magnetic cladding layers 1002 and 1202 concentrate the flux on the MTJ that makes up the MTJ cell 11', making the free layer 1104 easier to program.

Although this approach works well theoretically, one of ordinary skill in the art will readily recognize that the magnetic properties of the portions of the soft cladding layers 1002 and 1202 on the vertical sidewalls of the conventional lines 10' and 12', respectively, are hard to control. One of ordinary skill in the art will also recognize that the process of making the conventional word line 10' and the conventional bit line 12' is complicated. Formation of the conventional word line 10' and conventional bit line 12' including the cladding layers 1002 and 1202, respectively, requires approximately nine thin film deposition steps, five photolithography steps, six etching steps, and one chemical mechanical polishing (CMP) step.

Furthermore, none of the processes can be shared with other CMOS processes. Some of the processes, such as the CMP process and a few thin-film deposition and etching processes, need to be tightly controlled in order to achieve the designed performance. Because the wafer surface on which the devices are fabricated is not flat and the portion to be removed is deep in the trenches, the write lines 10' and 12' need to be laid out fairly sparsely to accommodate the photolithography process. As a consequence, the density and capacity of memory devices on a chip will be sacrificed if soft magnetic cladding layer 1202 and 1002 is used for the lines 10' and 12'. This complicated fabrication methods pose significant challenge to scaling to higher densities. Accordingly it is highly desirable to provide an MRAM architecture which is scalable, easy to fabricate, and offers high writing efficiency.

Other aspects of the conventional write lines 10, 10', 12, and 12' of the conventional designs depicted in both FIG. 1 and FIG. 2 limit scalability. In these conventional designs, the conventional write lines 10, 10', 12, and 12' are mostly made of either aluminum or copper. The current density limits for aluminum and copper are in the order of $1 \times 10^6$ $A/cm^2$ or less. As the line width decreases to increase the memory density, the electromigration current density limit poses severe challenges for scaling.

Other conventional systems attempt to propose different solutions, each of which has its drawbacks. As an example, U.S. Patent Application Publication No. 2002/0080643 proposed that, after a write operation, a reverse current is applied to the write lines to prevent electromigration. But such conventional methods compromise performance by reducing the speed of the memory and add complexities. Thus, it is also highly desirable to have write line made of materials with high reliability in electromigration, which will allows for easy scalability to high density memory arrays.

Conventional thin bit lines, which might be used for smaller or more efficient memories have shortcomings. Thinner conventional bit lines have higher resistances. This adversely affects the performance of the overall memory array. However, there are many conventional methods of overcoming this issue. One common practice is to break up the long bit lines in the memory array into global bit lines that are made of thick metals, and connect the global bit lines into local bit lines that are made of thinner metals, and thus have a higher resistance. Examples of such design are taught by U.S. Pat. No. 6,335,890 and U.S. Patent Application Publication No. 2002/0034117. However, the other problems described above, such as the electromigration are still not overcome.

Similarly, other conventional systems break write lines into segments, each of which is coupled, through a selection transistor, to a global write line having a much lower resistance. For example, U.S. Pat. No. 6,335,890 and U.S. Patent Application Publication No. 2002/0176272 describe systems which break conventional write lines into segments. During writing, only one segment of the conventional write line conducts current.

FIG. 3 depicts such a conventional design 20 incorporating a conventional segmented write line. The conventional design 20 includes conventional MTJs 31 serving as MRAM cells, a conventional segmented magnetic write line 32, conventional global write and return lines 28 and 30, respectively, conventional selection transistors 26, conventional digit lines 24, and conventional bit selection transistors 22. The conventional segmented write line 32 is connected to the conventional global write line 28 and to the conventional global write return line 30, through the conventional section selection transistor 26. Other segments (not shown) would be connected to the conventional global write line 28 and conventional global write return line 30 in a similar manner. For illustration, the section of the conventional segmented write line 32 is connected to four conventional MTJs 31. In a conventional configuration, each conventional MTJ 31 is then connected to a ground line through a conventional bit selection transistor 22. The conventional digit line 24 runs orthogonal to the conventional write line 32 at each conventional MTJ 31.

During writing, the conventional transistor 26 is turned on to allow a write current to flow from the conventional global write line 28, through the segment of the conventional segmented write line 32, to the conventional to global write return line 30. The magnetic field generated by the write current in the conventional segmented write line 32 simultaneously disturbs the magnetic vectors of the free layers of the four conventional MTJs 31 contained in the section. Depending on the magnitude and polarities of currents flowing in the conventional digit lines 24, digital data are written into the conventional MTJs 31. In this way four MRAM cells can be written at the same time.

Although four MRAM cells can be written in parallel, one of ordinary skill in the art will readily recognize that during reading only one of the four bit selection transistors 22 can be turned on. When one of the four bit selection transistors 22 is turned on, the voltage on the conventional global write line 28 (as connected to the conventional segmented write line 32) can be measured to determine the logical state of the selected MTJ 31. Thus, although data in the four cells of the section can be written in parallel, the data stored in the four cells are read in series. One of ordinary skill in the art will readily recognize, therefore, that reading of data stored in the MTJs 31 may be less efficient than desired. Furthermore, other problems described above, such as the electromigration are still not overcome.

Accordingly, what is needed is a system and method for providing a scalable, efficient, low current magnetic memory that improves ease of manufacturing and reliability against electromigration. It would also be desirable to provide an architecture which can support a simpler driver design, and can be read more efficiently. Moreover, it is desirable to arrange the global write lines such that there is minimal magnetic interference induced by the currents flowing in the global write lines on MRAM cells. It would also be desirable to achieve a system and method for providing a high-density nonvolatile MRAM capable of having greater margin in writing as well as efficient reading operations. The present invention addresses such a need.

SUMMARY OF THE INVENTION

The present invention provides a method and system for providing and using a magnetic random access memory (MRAM) array. The method and system comprise providing a plurality of magnetic storage cells, a plurality of global word lines and word line segments, a plurality of global bit lines and bit line segments, and a plurality of selection devices. Each of the word line segments is coupled with at least one of the global word lines such that the word line segments are selectable. Each of the word line segments is coupled to a first portion of the magnetic storage cells. Each of the bit line segments is coupled with at least one of the global bit lines such the bit line segments are selectable. Each of the bit line segments resides in proximity to and is used to write to the second portion of the plurality of magnetic storage cells. The bit line segments and the word line segments are coupled with and selectable using the plurality of selection devices.

According to the system and method disclosed herein, the present invention provides a magnetic memory having improved writing margin and reading efficiency.

DETAILED DESCRIPTION OF THE INVENTION

The present invention relates to an improvement in magnetic memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Figure 1:
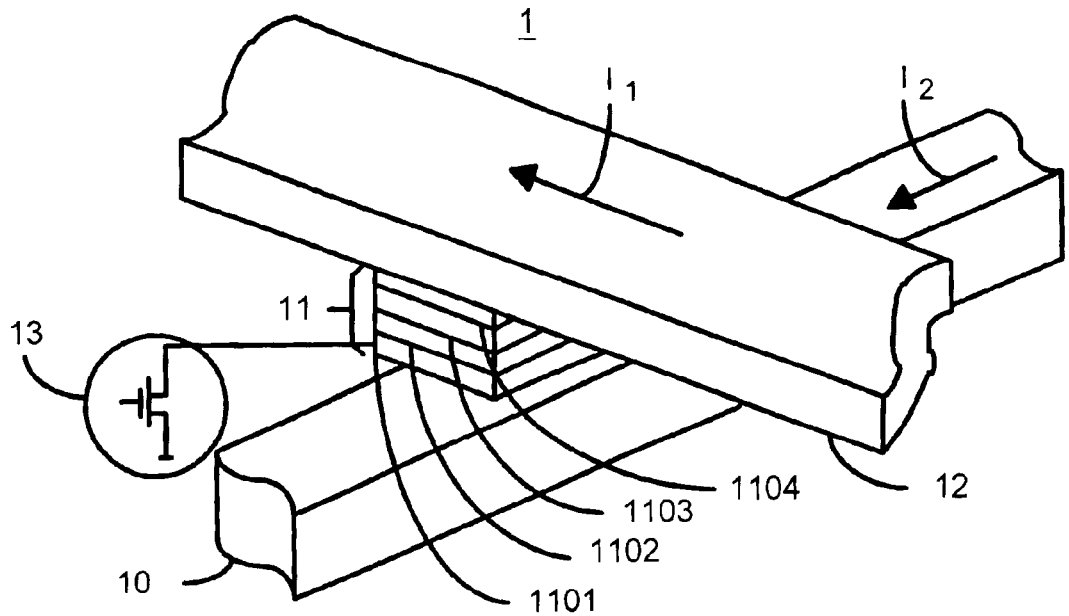
FIG. 1 is a three-dimensional view of a conventional MRAM cell containing a conventional MTJ, located at the intersection of a conventional bit line and a conventional word line.
Figure 2:
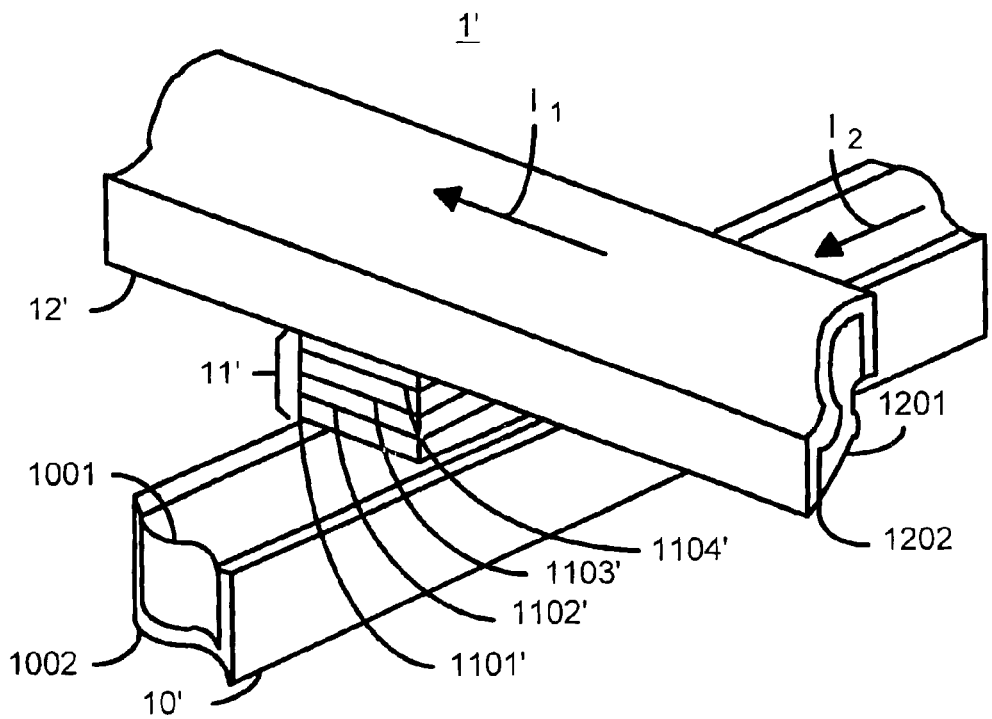
FIG. 2 is a three-dimensional view of another conventional MTJ in a conventional MRAM cell with a conventional magnetic write line.
Figure 3:
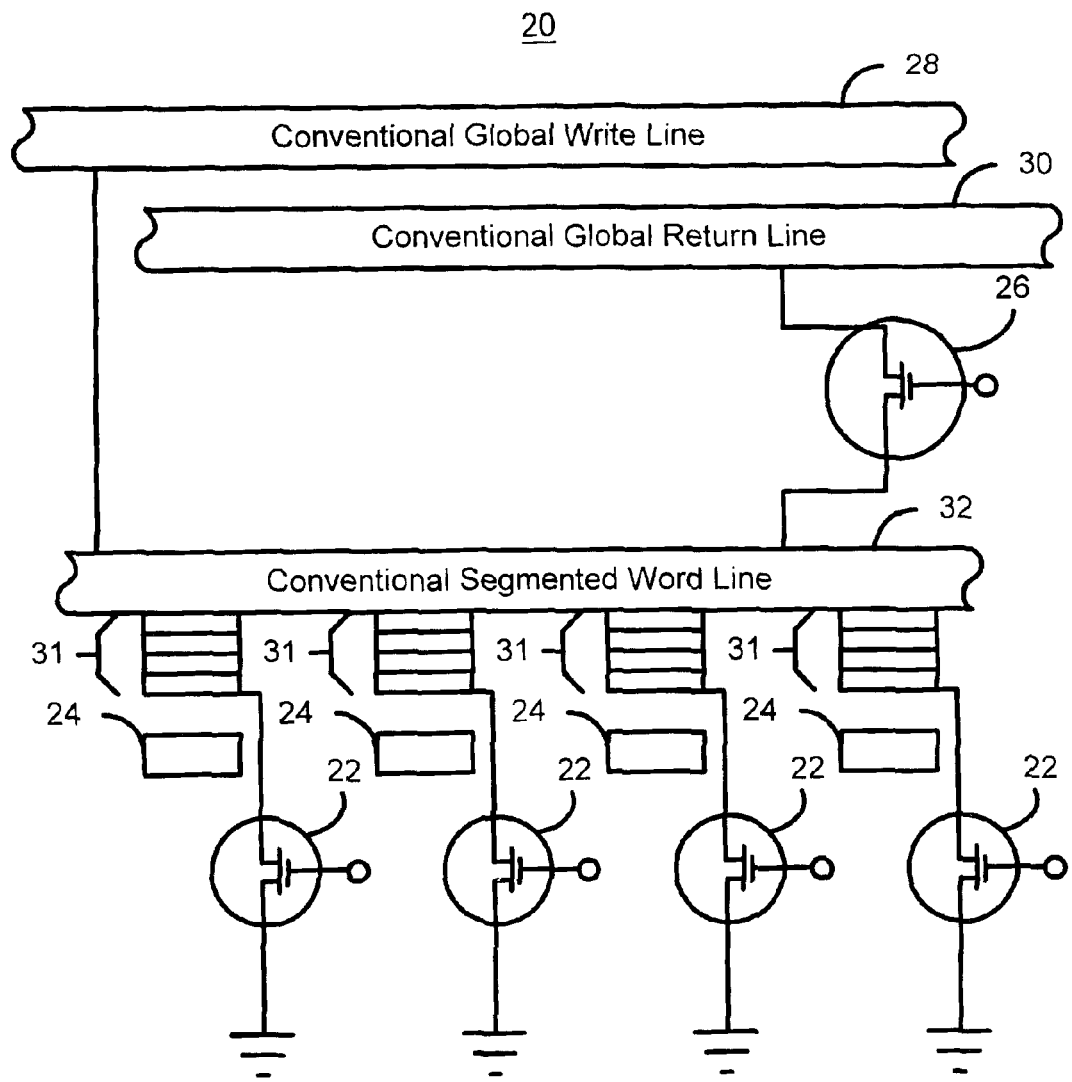
FIG. 3 is a diagram depicting a conventional configuration of conventional segmented magnetic write lines.
Figure 4A:
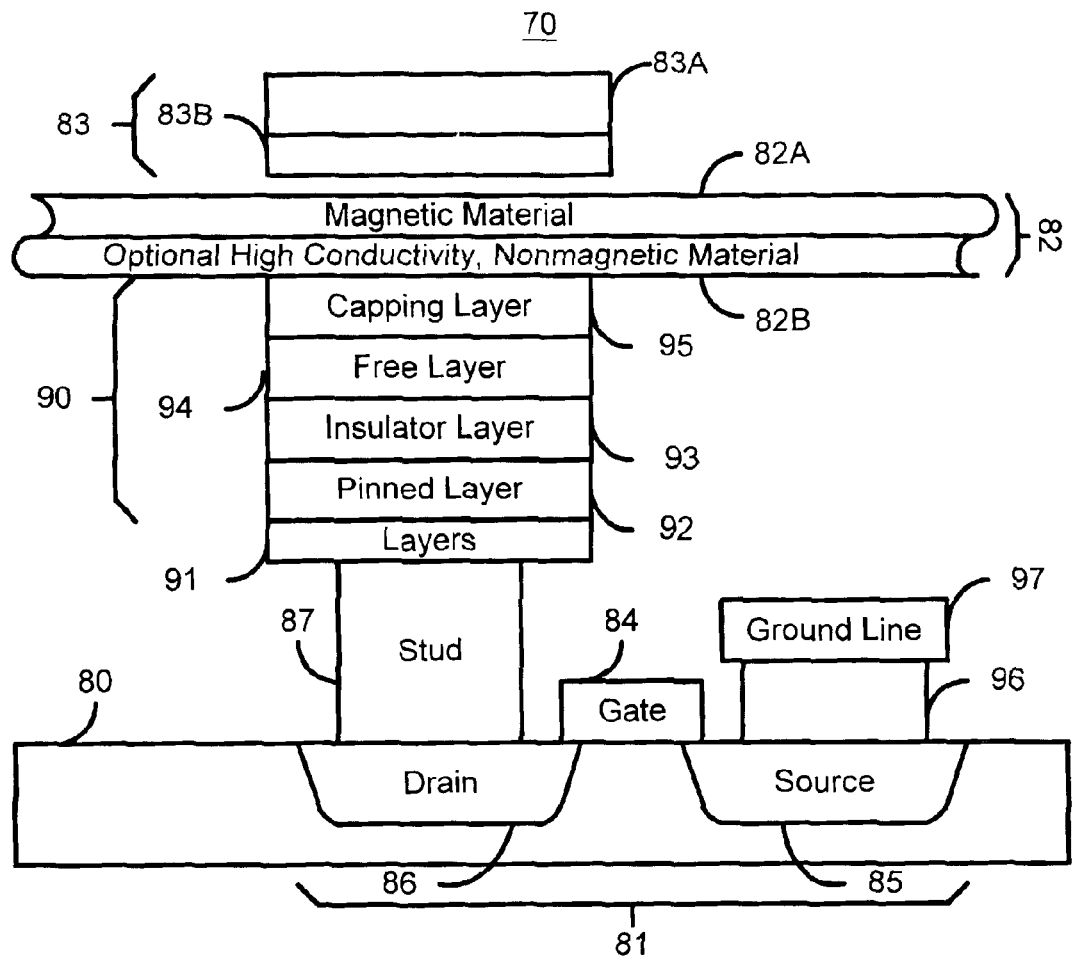
FIG. 4A is a diagram depicting one embodiment of a portion of an MRAM utilizing magnetic write lines.

Co-pending U.S. patent application Ser. No. 10/459,133 entitled "MRAM MEMORIES UTILIZING MAGNETIC WRITE LINES" assigned to the assignee of the present application describes a MRAM architecture that addresses many of the issues encountered in conventional MRAM deices. Applicant hereby incorporates by reference the above-identified co-pending application. FIG. 4A depicts one embodiment of a portion of an MRAM 70 including the basic structure described in the above-identified co-pending application. The MRAM 70 depicted in FIG. 4A includes a magnetic element 90, which is preferably a MTJ stack 90, a selection device 81 formed in a substrate 80, a magnetic write line 82 that is preferably a bit line, a word line 83, a conductive stud 87, connecting stud 96 and ground line 97. The selection device 81 is preferably a FET transistor including gate 84, source 85 and drain 86. The MTJ stack includes the pinned layer 92 having a fixed magnetic vector (not shown), a tunneling layer 93, a free layer 94 having a changeable magnetic vector (not shown), and a conductive capping layer 95. The conductive capping layer 95 is preferably a nonmagnetic spacer layer 95. The MTJ stack also includes layers 91 that includes seed and, preferably, anti-ferromagnetic layers.

The magnetic write line 82 includes soft magnetic materials and is separated from the free layer 94 of the MTJ stack 90 by the non-magnetic spacer layer 95. The magnetic write line 82 is preferably substantially or completely composed of a soft magnetic material. In addition, at least a core, as opposed to a cladding layer, includes the soft magnetic layer. In the embodiment shown, the magnetic write line 82 includes a soft magnetic portion 82A and a higher conductivity nonmagnetic portion 82B, for example made of copper. However, in an alternate embodiment, the entire magnetic write line 82 is composed of a soft magnetic material. In addition, the write line 83 may be magnetic. In a preferred embodiment, as shown in FIG. 4A, the write line 82 includes a soft magnetic portion 82A and a high conductivity non-magnetic portion 82B. The non-magnetic spacer layer 95 is preferably thin, for example less than or equal to three hundred Angstroms in thickness. Due to the small spacing between the magnetic write line 82 and the free layer 94, the magnetic vector of free layer 94 is strongly coupled magnetostatically to the magnetic vector of the magnetic write line 82. Such a magnetostatic coupling promotes rotation amplitude for the free layer magnetic vector. Hence, using the method and system described in the above-identified co-pending application, a lower current can be used because of the strong magnetic coupling between the soft magnetic write line 82 and the MTJ 90. Furthermore, because of the excellent electromigration reliability of magnetic alloys, the magnetic write lines can be made thin for ease of fabrication and better packing density.

Figure 4B:
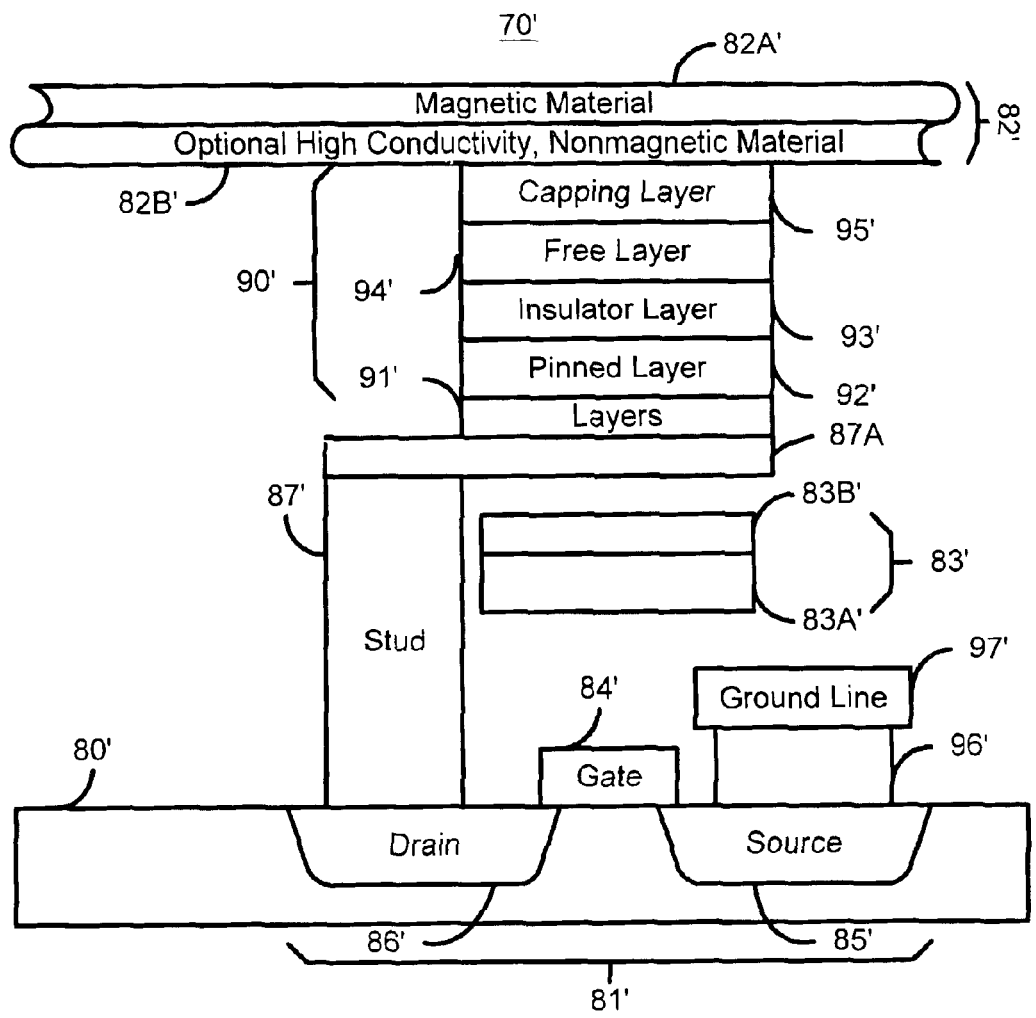
FIG. 4B is a diagram depicting another embodiment of a portion of an MRAM utilizing magnetic write lines.

FIG. 4B depicts another embodiment of the MRAM 70' including the magnetic write line 83'. Many components of the MRAM 70' are analogous to those in the MRAM 70 depicted in FIG. 4A. Consequently, these components are labeled similarly. The magnetic write line 82' can include only the soft magnetic material 82A' or, as depicted, may include both the soft magnetic material 82A' and the high conductivity nonmagnetic material 82B'. The word line 83' is, however, placed beneath the magnetic element 90' and is connected to the MTJ stack 90 through a conductive layer 87A. In addition, the write line 83' may be magnetic.

Although the method and system described in the above-identified co-pending application function well for their intended purpose, one of ordinary skill in the art will readily recognize that the magnetic write lines often have a relatively high resistance. Due to the combination of the small thickness and the use of the higher resistivity of magnetic alloys, the line resistance of magnetic write lines may be much larger than conventional write lines of primarily copper or aluminum. This high resistivity can create difficulties for write driver circuit designs.

Co-pending U.S. patent application Ser. No. 10/646,455, entitled "MRAM ARRAY WITH SEGMENTED MAGNETIC WRITE LINES", filed on Aug. 21, 2003, and assigned to the assignee of the present application describes an architecture in which magnetic word lines may be segmented. In particular, word lines, such as the lines 83 and 83' may be divided into segments. Each segment is coupled with the global word line(s) such that each segment is separately selectable. Each segment is also coupled to a portion of the magnetic storage cells. The segments of the magnetic word lines may include soft magnetic materials and are coupled to each magnetic storage cell through a thin, nonmagnetic layer. In some embodiment, the magnetic word lines include a high conductivity layer as well as a soft magnetic layer. Consequently, writing efficiency is improved. The global word lines preferably have a low resistance due to the use of a high conductivity material in the global word lines. Thus, the drawbacks due to high resistivity materials can be mitigated.

Although the method and system described in the above-identified co-pending application function well for their intended purpose, one of ordinary skill in the art will readily recognize that the magnetic bit lines often have a relatively high resistance. The architecture described in the above-identified co-pending application may not, therefore, have the desired performance due to the high resistance of the magnetic bit lines.

The present invention provides a method and system for providing and using a magnetic random access memory (MRAM) array. The method and system comprise providing a plurality of magnetic storage cells, a plurality of global word lines and global word line segments, a plurality of global bit lines and bit line segments, and a plurality of selection devices. Each of the word line segments is coupled with at least one of the global word lines such that the word line segments are selectable. Each of the word line segments is magnetically coupled to the free layer of the magnetic storage cells. Each of the bit line segments is coupled with at least one of the global bit lines such the bit line segments are selectable. In a preferred embodiment, each of the bit line segments are both electrically and magnetically coupled to and is used to write to of magnetic storage cells. The bit line segments and the word line segments are coupled with and selectable using the plurality of selection devices.

The present invention will be described in terms of particular types of magnetic memory cells, particular materials and a particular configuration of elements. However, one of ordinary skill in the art will readily recognize that this method and system will operate effectively for other magnetic memory cells, and other materials and configurations non inconsistent with the present invention.

Figure 5:
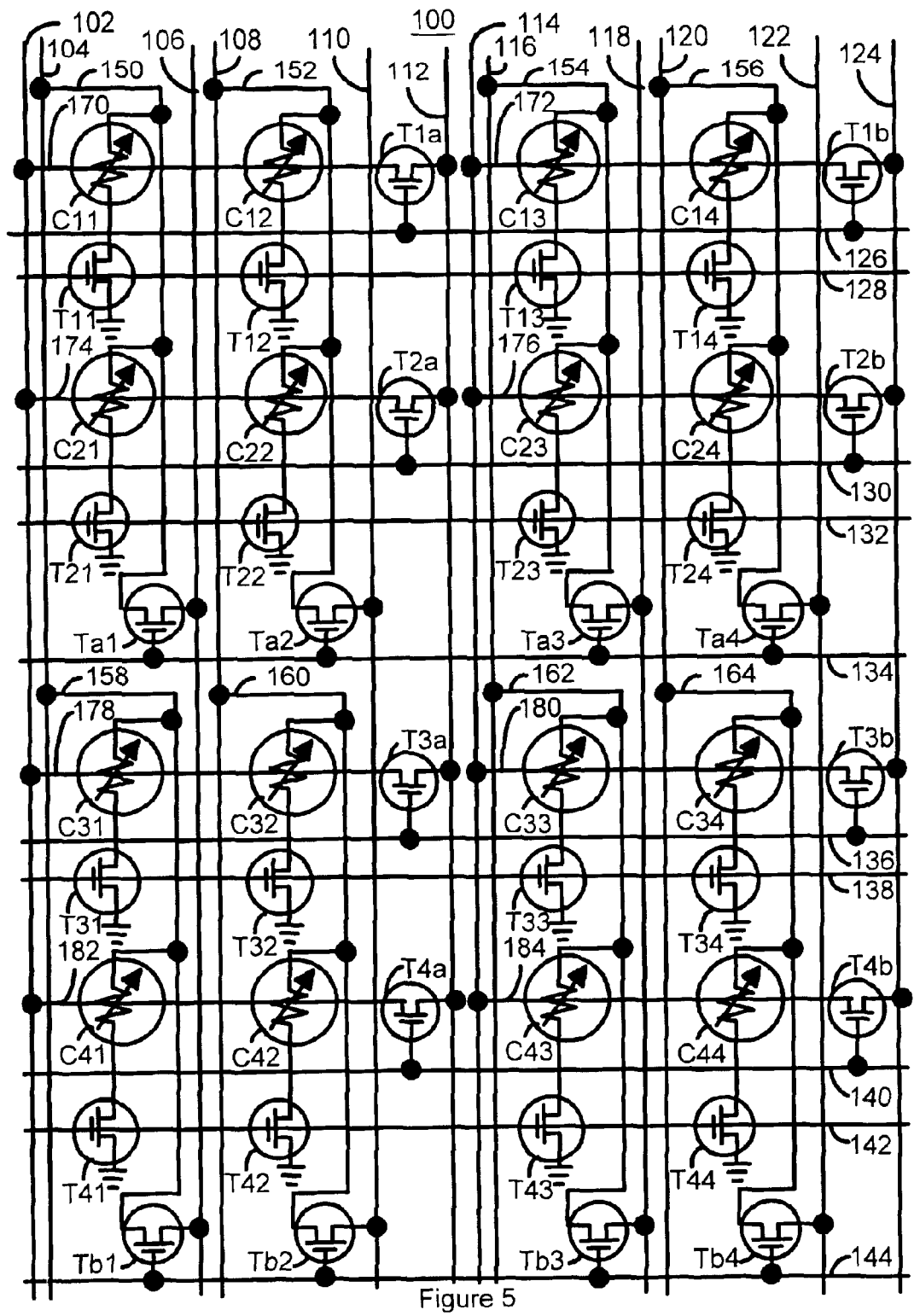
FIG. 5 is a schematic diagram illustrating a first embodiment of a portion of an MRAM in accordance with the present invention.

To more particularly illustrate the method and system in accordance with the present invention, refer now to FIG. 5, depicting one embodiment of an MRAM array 100 in accordance with the present invention. The MRAM array 100 includes magnetic storage cells C11, C12, C13, C14, C21, C22, C23, C24, C31, C32, C33, C34, C41, C42, C43, and C44. The magnetic storage cells C11, C12, C13, C14, C21, C22, C23, C24, C31, C32, C33, C34, C41, C42, C43, and C44 are preferably MTJs, as depicted in FIGS. 4A and 4B. However, in an alternate embodiment, other types of cells, such as GMR or AMR cells, could be used. Each magnetic storage cell C11, C12, C13, C14, C21, C22, C23, C24, C31, C32, C33, C34, C41, C42, C43, and C44 is coupled to ground via read selection devices that are preferably transistors T11, T12, T13, T14, T21, T22, T23, T24, T31, T32, T33, T34, T41, T42, T43, and T44. The MRAM array 100 includes global word lines 102 and 114 coupled with global word line returns 112 and 124, respectively. In an alternate embodiment, the selection devices could be diodes. The MRAM array also includes global bit lines 104, 108, 116 and 120 that may be coupled with global bit line returns 106, 110, 118, and 122, respectively. In addition, the MRAM array 100 includes write word lines 126, 130, 136, and 140 as well as read word lines 128, 132, 138, and 142. The MRAM array 100 also includes word partition lines 134 and 144.

The word lines of the MRAM 100 are segmented, preferably in the manner analogous to that disclosed in the above-identified co-pending patent application. Consequently, the MRAM 100 includes word line segments 170, 172, 174, 176, 178, 180, 182, and 184. The word line segments 170, 174, 178, and 182 are coupled to global word line 102 at one end. The word line segments 170, 174, 178, and 182 can also be coupled with global word return line 112 through selection devices that are preferably selection transistors T1a, T2a, T3a, and T4a, respectively. In an alternate embodiment, the selection devices could be diodes. Similarly, the word line segments 172, 176, 180, and 184 are coupled to global word line 114 at one end. The word line segments 172, 176, 180, and 184 can also be coupled with global word return line 124 through selection devices that are preferably selection transistors T1b, T2b, T3b, and T4b, respectively.

Each word line segment 170, 172, 174, 176, 178, 180, 182, and 184 is coupled to two magnetic storage cells. In the embodiment shown, the word line segment 170 passes by magnetic storage cells C11 and C12. The word line segment 172 passes by magnetic storage cells C13 and C14. The word line segment 174 passes by magnetic storage cells C21 and C22. The word line segment 176 passes by magnetic storage cells C23 and C24. The word line segment 178 passes by magnetic storage cells C31 and C32. The word line segment 180 passes by magnetic storage cells C33 and C34. The word line segment 182 passes by magnetic storage cells C41 and C42. The word line segment 182 passes by magnetic storage cells C43 and C44.

The bit lines of the MRAM 100 are also segmented. Consequently, the MRAM 100 includes bit line segments 150, 152, 154, 156, 158, 160, 162, and 164. The word line segments 170, 172, 174, 176, 178, 180, 182, and 184 and/or the bit line segments 150, 152, 154, 156, 158, 160, 162, and 164 may be magnetic as described in the above-identified co-pending application. The bit line segments 150 and 158 are coupled to global bit line 104 at one end. The bit line segments 150 and 158 can also be coupled with global return line 106 through selection devices that are preferably selection transistors Ta1 and Tb1, respectively. Similarly, the bit line segments 152 and 160 are coupled to global bit line 108 at one end. The bit line segments 152 and 160 can also be coupled with global return line 110 through selection devices that are preferably selection transistors Ta2 and Tb2, respectively. The bit line segments 154 and 162 are coupled to global bit line 116 at one end. The bit line segments 154 and 162 can also be coupled with global return line 118 through selection devices that are preferably selection transistors Ta3 and Tb3, respectively. The bit line segments 156 and 164 are coupled to global bit line 120 at one end. The bit line segments 156 and 164 can also be coupled with global return line 122 through selection devices that are preferably selection transistors Ta4 and Tb4, respectively.

The bit line segments 150, 152, 154, 156, 158, 160, 162, and 164 preferably include a conductive soft magnetic material. In one embodiment, one or more of the bit line segments 150, 152, 154, 156, 158, 160, 162, and 164 are completely composed of a conductive soft magnetic material. In an alternate embodiment, one or more of the bit line segments 150, 152, 154, 156, 158, 160, 162, and 164 include a soft magnetic material formed on a high conductivity material, such as copper. Thus, the bit line segments 150, 152, 154, 156, 158, 160, 162, and 164 may be analogous to the bit lines 82 and 82 of FIGS. 4A and 4B. Referring back to FIG. 5, the soft magnetic material(s) used in the bit line segments 150, 152, 154, 156, 158, 150, 162, and 164 may be a single material such as nickel, cobalt, iron or an alloy thereof, or may be a composite including more than one layer. The high conductivity metal is preferably copper, aluminum, gold, an alloy thereof or a composite layer. In addition, other layers such as barrier layers (not shown) and/or adhesion layers (not shown) could be provided. Moreover, to improve efficiency, the thickness of the bit line segments 150, 152, 154, 156, 158, 160, 162, and 164 is preferably much smaller than the width. For example, the thickness of the bit line segments 150, 152, 154, 156, 158, 160, 162, and 164 is preferably approximately one fourth of the width.

Each bit line segment 150, 152, 154, 156, 158, 160, 162, and 164 is coupled to two magnetic storage cells. In the embodiment shown, the bit line segment 150 is coupled to magnetic storage cells C11 and C21. The bit line segment 152 is coupled to magnetic storage cells C12 and C22. The bit line segment 154 is coupled to magnetic storage cells C13 and C23. The bit line segment 156 is coupled to magnetic storage cells C14 and C24. The bit line segment 158 is coupled to magnetic storage cells C31 and C41. The bit line segment 160 is coupled to magnetic storage cells C32 and C42. The bit line segment 162 is coupled to magnetic storage cells C33 and C43. The bit line segment 164 is coupled to magnetic storage cells C34 and C44. Thus, both the bit lines and the word lines of the MRAM 100 are segmented.

The magnetic cells C11, C12, C13, C14, C21, C22, C23, C24, C31, C32, C33, C34, C41, C42, C43, and C44 are written to by passing currents through various word lines and bit lines, depending upon to which cells data are being written. For example, suppose data are written to cells C33 and C34. Current must flow through the appropriate word lines and bit lines. To write to cells C33 and C34, the global word line 114 is coupled with a word line current source (not shown), while the global word line return 124 is coupled to a word line current sink (not shown). A voltage is provided on write word line 136, which enables the selection transistor T3b. Consequently, current flows through the word line segment 180 of the global word line 114, in proximity to the cells C33 and C34, and returns via global word line return 124. Cells C33 and C34 are written, preferably simultaneously, using different bit line segments 162 and 164, respectively. The bit line current and polarity are supplied for C33 using global bit line 116 and its corresponding global bit line return 118. Depending upon the data to be written, the global bit line 116 is connected to one of the bit line current source (not shown) or the bit line current sink (not shown), while the global bit line return 118 is connected to the other of the bit line current sink or bit line current source, respectively. To enable the appropriate bit line segment 162 for C33, an enable voltage is provided to the partition line 144, which enables transistor Tb3 (as well as transistor Tb4). The appropriate currents for writing to the cell C33 thus flow through word line segment 180 and bit line segment 162. To write to the cell C34, the bit line current and polarity are supplied for C34 using global bit line 120 and its corresponding global bit line return 122. Depending upon the data to be written, the global bit line 120 is connected to one of the bit line current source (not shown) or the bit line current sink (not shown), while the global bit line return 122 is connected to the other of the bit line current sink or bit line current source, respectively. To enable the appropriate bit line segment 164 for C33, the enable voltage provided to the partition line 144, which enables transistor Tb3, also enables the transistor Tb4. The appropriate currents for writing to the cell C34 thus flow through word line segment 180 and bit line segment 164. The other cells C11, C12, C13, C14, C21, C22, C23, C24, C31, C32, C41, C42, C43, and C44 are written to in an analogous manner.

To read the data stored in cells C33 and C34, an enable signal is provided to the appropriate read word line, 138. Consequently, the transistors T33 and T34 are enabled. Consequently, the cells C33 and C34 are coupled to ground. A read current is provided through global bit lines 116 and 120 for cells C33 and C34, respectively. Consequently, the current flows through bit line segments 162 and 164 and to ground through cells C33 and C34, respectively. The voltage of the global bit lines 116 and 120 can be measured to determine the states of the cells C33 and C34, respectively. Thus, the data in cells C33 and C34 can be read.

Using the MRAM 100, therefore, thinner bit line segments 150, 152, 154, 156, 158, 160, 162, and 164 and thinner word line segments 170, 172, 174, 176, 178, 180, 182, and 184 can be provided. As a result, a more efficient writing architecture can be achieved. Moreover, the global bit lines 104 and 106, 108 and 110, 116 and 118, and 120 and 122, as well as the global word lines 102 and 112 and 114 and 124 can be made thicker, as well as using higher conductivity materials. Consequently, the benefits of thinner word and bit lines can be achieved without sacrificing performance due to high resistivity of thinner lines. In addition, in the architecture depicted in FIG. 5, the global word lines 102 and 114, the global word line returns 112 and 124 are parallel to the global bit lines 104, 108, 116 and 118 as well as to the global bit line returns 106, 110, 118, and 122. Consequently, these structures 102, 104, 106, 108, 110, 116, 118, 120, 122, and 124 may be fabricated on the same layer, further reducing the cost of fabricating the MRAM 100. Furthermore, if the bit line segments 150, 152, 154, 156, 158, 160, 162, and 164 and word line segments 170, 172, 174, 176, 178, 180, 182, and 184 are composed all or in part of magnetic materials, for example as shown in FIGS. 4A and 4B, the performance can be achieved without complicating fabrication of the MRAM 100. As a result, performance of the MRAM 100 can be enhanced while simplifying processing and reducing cost.

Figure 6:
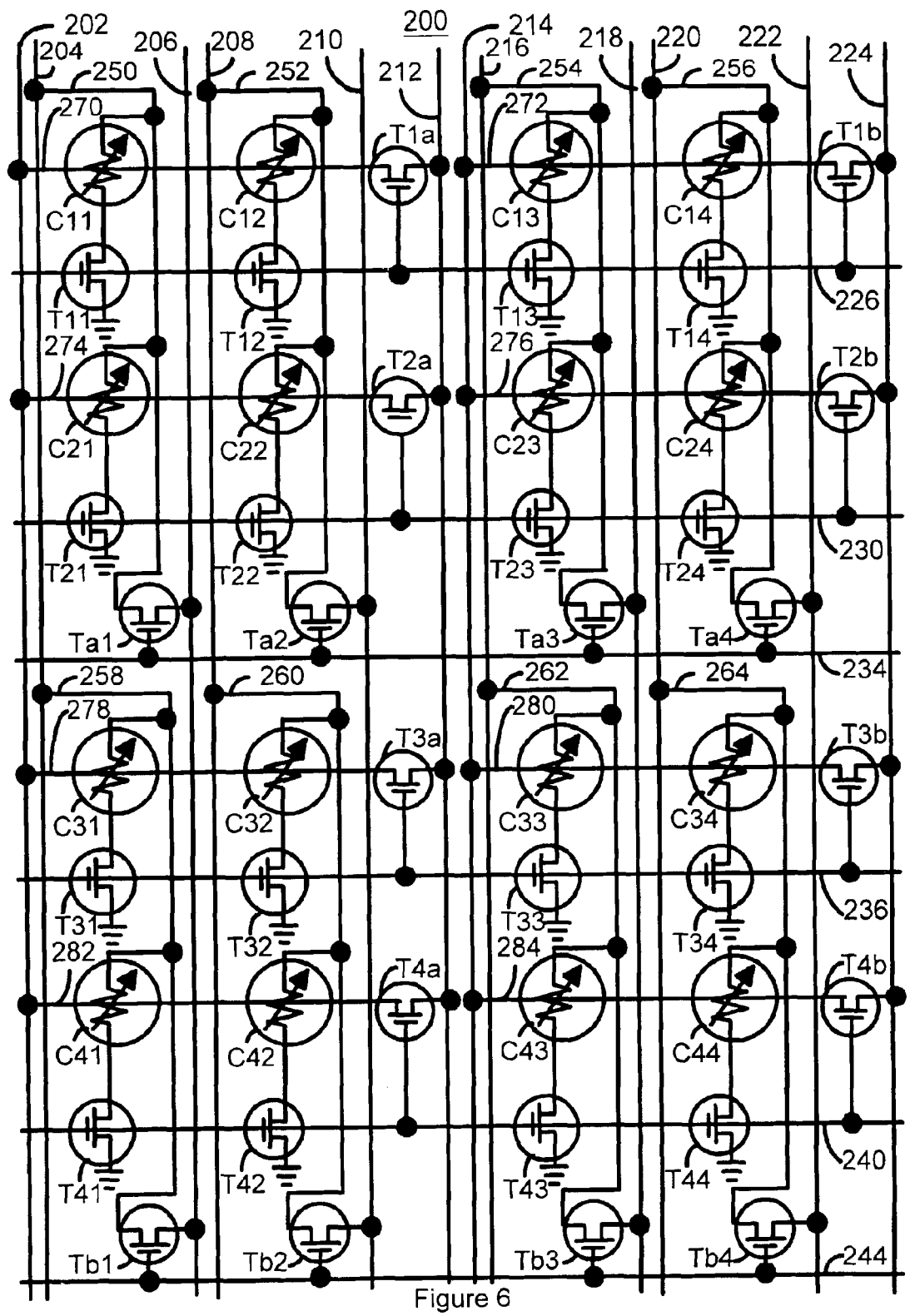
FIG. 6 is a schematic diagram illustrating a second embodiment of a portion of an MRAM in accordance with the present invention.

FIG. 6 is a schematic diagram illustrating a second embodiment of a portion of an MRAM 200 in accordance with the present invention. Elements of the MRAM 200 are analogous to those in the MRAM 100. Consequently, such components are labeled similarly. For example, the MRAM 200 includes cells C11, C12, C13, C14, C21, C22, C23, C24, C31, C32, C33, C34, C41, C42, C43, and C44. Similarly, the MRAM 200 includes global word lines 202 and 214 (analogous to global word lines 102 and 114 of FIG. 5) and global word line returns 212 and 224 (analogous to global word line returns 112 and 124 of FIG. 5). However, the MRAM 200 has combined at least a portion of the read word lines and the write word lines of FIG. 5 into a single line. Referring to FIGS. 5 and 6, the MRAM 200 thus includes read word lines 226, 230, 236, and 240 as well as partition lines 234, and 244.

The MRAM 200 is read in the same way as the MRAM 100, using the read word line 226, 230, 236, or 240 to enable the appropriate transistors and coupled the appropriate cells to ground. For example, in reading cells C33 and C34, the read word line 236 enables transistors T33 and T34 (as well as transistor T3b) to couple the cells to ground. A current passed through the bit lines 216 and 220 is thus transmitted through bit line segments 262 and 264 and through the cells C33 and C34, respectively, to ground.

The MRAM 200 can be written to in an analogous manner to the MRAM 100. Thus, current flows through the appropriate word and bit line segments during writing. However, a minimum voltage drop across the any MTJ stacks in the cells C11, C12, C13, C14, C21, C22, C23, C24, C31, C32, C33, C34, C41, C42, C43, and C44 is preferably ensured during writing. Thus, if the cells C11, C12, C13, C14, C21, C22, C23, C24, C31, C32, C33, C34, C41, C42, C43, and C44 use an MTJ as a storage element, the minimum voltage ensures that the insulating layer, such as the layer 93 or 93', does not undergo breakdown. In general, it is believed that a voltage on the global bit lines 104, 108, 116, and 120 should be less than one volt during writing. In the alternative or in addition to reducing the voltage on the global bit lines 104, 108, 116, and 120, the cells C11, C12, C13, C14, C21, C22, C23, C24, C31, C32, C33, C34, C41, C42, C43, and C44 can be connected to a voltage source through transistors T11, T12, T13, T14, T21, T22, T23, T24, T31, T32, T33, T34, T41, T42, T43, and T44 (instead of ground) during writing. During writing, the voltage source would provide a voltage sufficient to ensure a minimum voltage drop across any stacks in the cells C11, C12, C13, C14, C21, C22, C23, C24, C31, C32, C33, C34, C41, C42, C43, and C44.

Thus, the MRAM 200 enjoys essentially the same benefits as the MRAM 100 depicted in FIG. 5. For example, a more efficient architecture can be achieved while simplifying processing and reducing the cost of the MRAM 200. Data can be read and written in parallel to cells on the same word line segment and/or bit line segment. Furthermore, some read and write word lines have been merged to lines 226, 230, 236, and 240. Consequently, the MRAM 200 is even simpler to fabricate.

Figure 7:
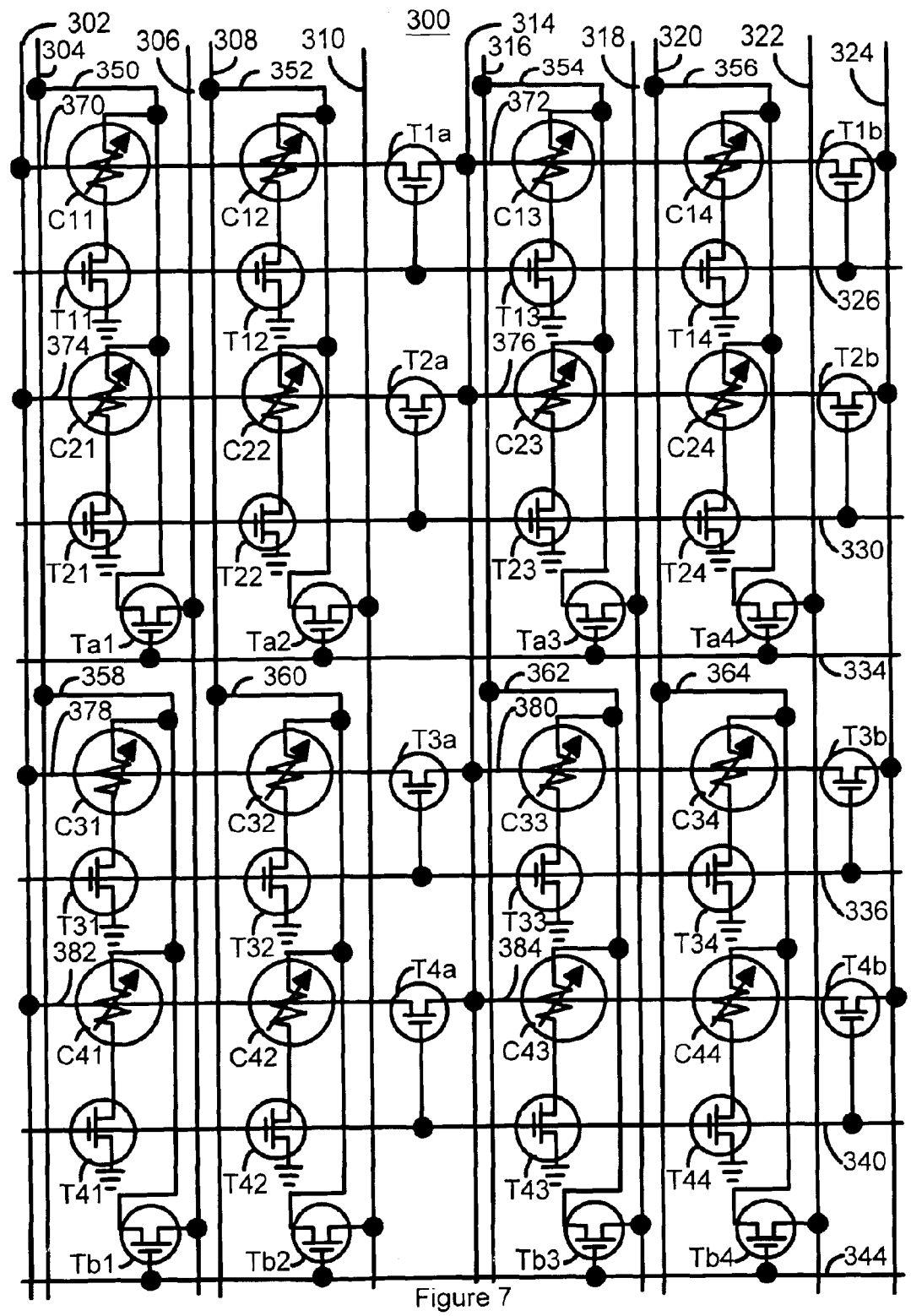
FIG. 7 is a schematic diagram illustrating a third embodiment of a portion of an MRAM in accordance with the present invention.

FIG. 7 is a schematic diagram illustrating a third embodiment of a portion of an MRAM 300 in accordance with the present invention. Elements of the MRAM 300 are analogous to those in the MRAM 200. Consequently, such components are labeled similarly. For example, the MRAM 300 includes cells C11, C12, C13, C14, C21, C22, C23, C24, C31, C32, C33, C34, C41, C42, C43, and C44. Similarly, the MRAM 300 includes global bit lines 304, 308, 316, and 320 (analogous to global bit lines 204, 208, 216, and 220 FIG. 6). However, the MRAM 300 has combined at least a portion of the word return lines and global word lines of FIG. 6. Referring to FIGS. 6 and 7, the MRAM 300 thus includes global bit lines 304, 308, 316, and 320, global bit line returns 306, 310, 318 and 322, but includes only global write lines 302 and 314 and global word line return 324.

The MRAM 300 is read in the same way as the MRAM 100, using the read word line 326, 330, 336, or 340 to enable the appropriate transistors and coupled the appropriate cells to ground. For example, in reading cells C11 and C12, the read word line 326 enables transistors T11 and T12 (as well as transistor T1a) to couple the cells C11 and C12 to ground. A current passed through the global bit lines 304 and 308 is thus transmitted through bit line segments 350 and 352 and through the cells C33 and C34, respectively, to ground.

During writing, the appropriate global word lines 302, 314, and 324 are used for writing. Either global word line 314 or global word line 324 may be used as a return, depending upon the cells in which data are being stored. In particular, if cells corresponding to a particular word line 302 or 314 are written, an adjacent word line 314 or 324, respectively, is used as a global word line return. For example, when writing to cells C31 and C32, the global word line 302 is coupled with a word line current source (not shown). The adjacent global word line 314 is coupled with a word line current sink. An enable voltage is provided to read word line 336. Consequently, the transistor T3a is enabled and current flows through the word line segment 178 (as well as word line segment 180). In addition, an enable voltage is provided to partition line 344. Consequently, transistors Tb1 and Tb2 are turned on. Bit line current sources and sinks are connected to the appropriate bit lines 304 and 308 and to the appropriate bit line returns 306 and 310. Consequently, the cells C31 and C32 can be written.

Thus, the MRAM 300 enjoys essentially the same benefits as the MRAM 200 depicted in FIG. 6. However, a more efficient architecture can be achieved while simplifying processing and reducing the cost of the MRAM 300. Data can be read and written in parallel to cells on the same word line segment and/or bit line segment. Furthermore, some word line returns have been eliminated by merging the return function with adjacent word lines. Consequently, the MRAM 200 is even simpler to fabricate.

Figure 8:
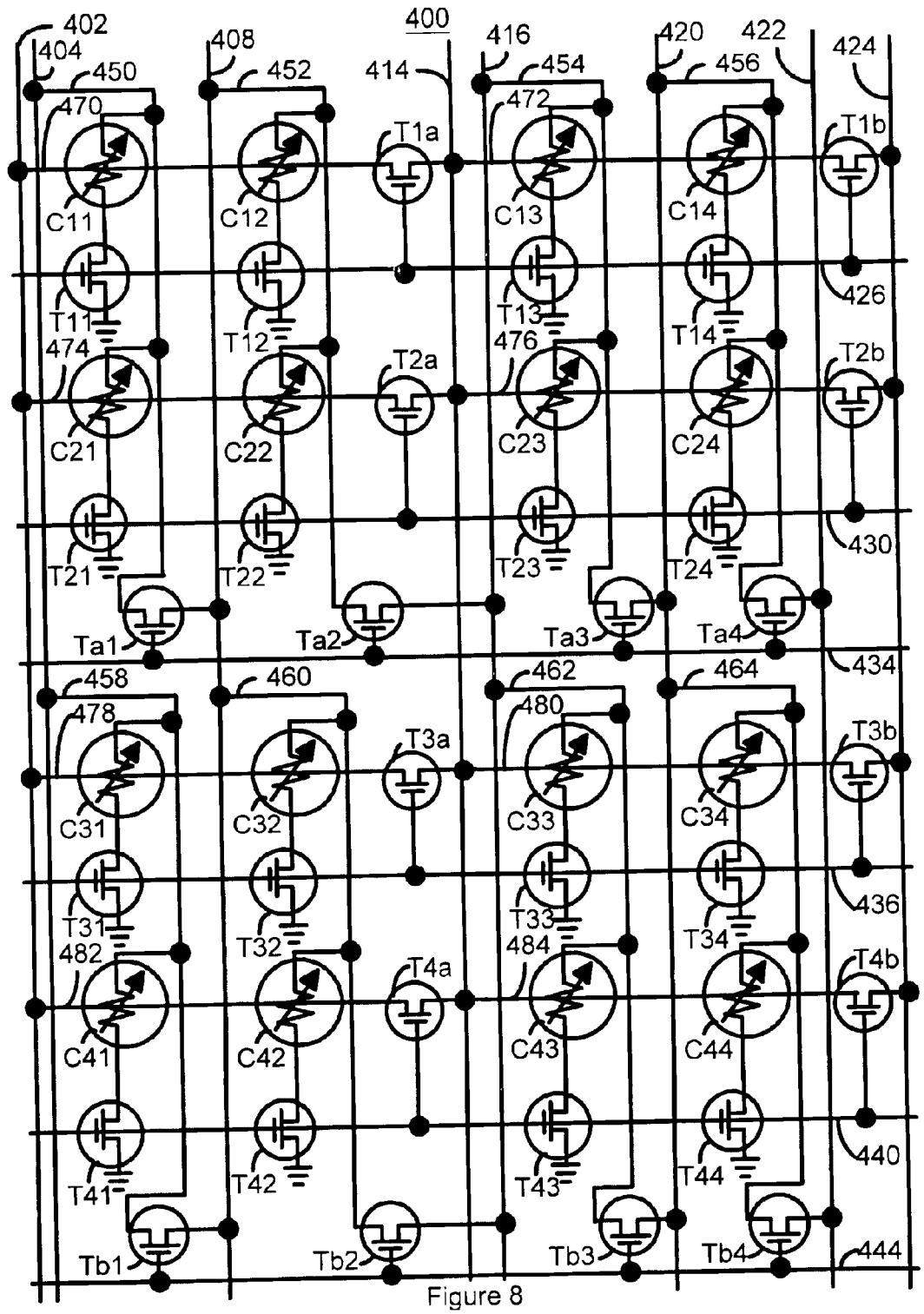
FIG. 8 is a schematic diagram illustrating a fourth embodiment of a portion of an MRAM in accordance with the present invention.

FIG. 8 is a schematic diagram illustrating a fourth embodiment of a portion of an MRAM 400 in accordance with the present invention. Elements of the MRAM 400 are analogous to those in the MRAM 300. Consequently, such components are labeled similarly. For example, the MRAM 400 includes cells C11, C12, C13, C14, C21, C22, C23, C24, C31, C32, C33, C34, C41, C42, C43, and C44. Similarly, the MRAM 400 includes global bit lines 404, 408, 416, and 420 (analogous to global bit lines 304, 308, 316, and 320 FIG. 7). However, the MRAM 400 has combined at least a portion of the global bit return lines and global bit lines of FIG. 7. In particular, the bit line returns 306, 310 and 318 have been eliminated. Referring to FIGS. 6 and 7, in the MRAM 400, the global bit lines 404, 408 and 416 use the global bit lines 408, 416, and 420, respectively, as return lines. Thus, a global bit line 408, 416, or 420 may function as a return line for an adjacent global bit line 402, 408, and 416, respectively.

The MRAM 400 is read in the same way as the MRAM 100, using the read word line 426, 430, 436, or 440 to enable the appropriate transistors and coupled the appropriate cells to ground. For example, in reading cells C11 and C12, the read word line 426 enables transistors T11 and T12 (as well as transistor T1a) to couple the cells C11 and C12 to ground. A current passed through the global bit lines 404 and 408 is thus transmitted through bit line segments 450 and 452 and through the cells C33 and C34, respectively, to ground.

During writing, the desired currents are provided through the appropriate bit line segments and word line segments in the desired polarity. In addition, adjacent global bit lines and adjacent global word lines may be used as return lines. As a result, two adjacent bits are not written simultaneously. For example, suppose data is to be written to cells C31 and C32. The global word line 402 is coupled with a word line current source (not shown), while the adjacent global word line 408 is coupled to a word line current sink (not shown). An enable voltage is provided via read word line 436. Consequently, transistor T3a is turned on. Thus, the word line current flows through the segment 478 and cells C31 and C32. The appropriate bit line current is provided by connecting bit line 404 to a bit line current source (not shown) and the bit line 408 to a bit line current sink (not shown), or vice versa. In addition, an enable voltage is provided over the partition line 444, which turns on transistors Tb1 (as well as transistors Tb2, Tb3, and Tb4). Thus, current travels through the bit line segment 458 and the cell C31 can be written. However, because the bit line 408 is used as a return, the cell C32 is not written to at the same time as the cell C31. In order to write to the cell C32, the appropriate bit line current is provided by connecting bit line 408 to a bit line current source (not shown) and the bit line 416 to a bit line current sink (not shown), or vice versa. The enable voltage is also provided over the partition line 444, which turns on transistor Tb2. Thus, current flows through bit line segment 460 and the cell C32 can be written.

Figure 9:
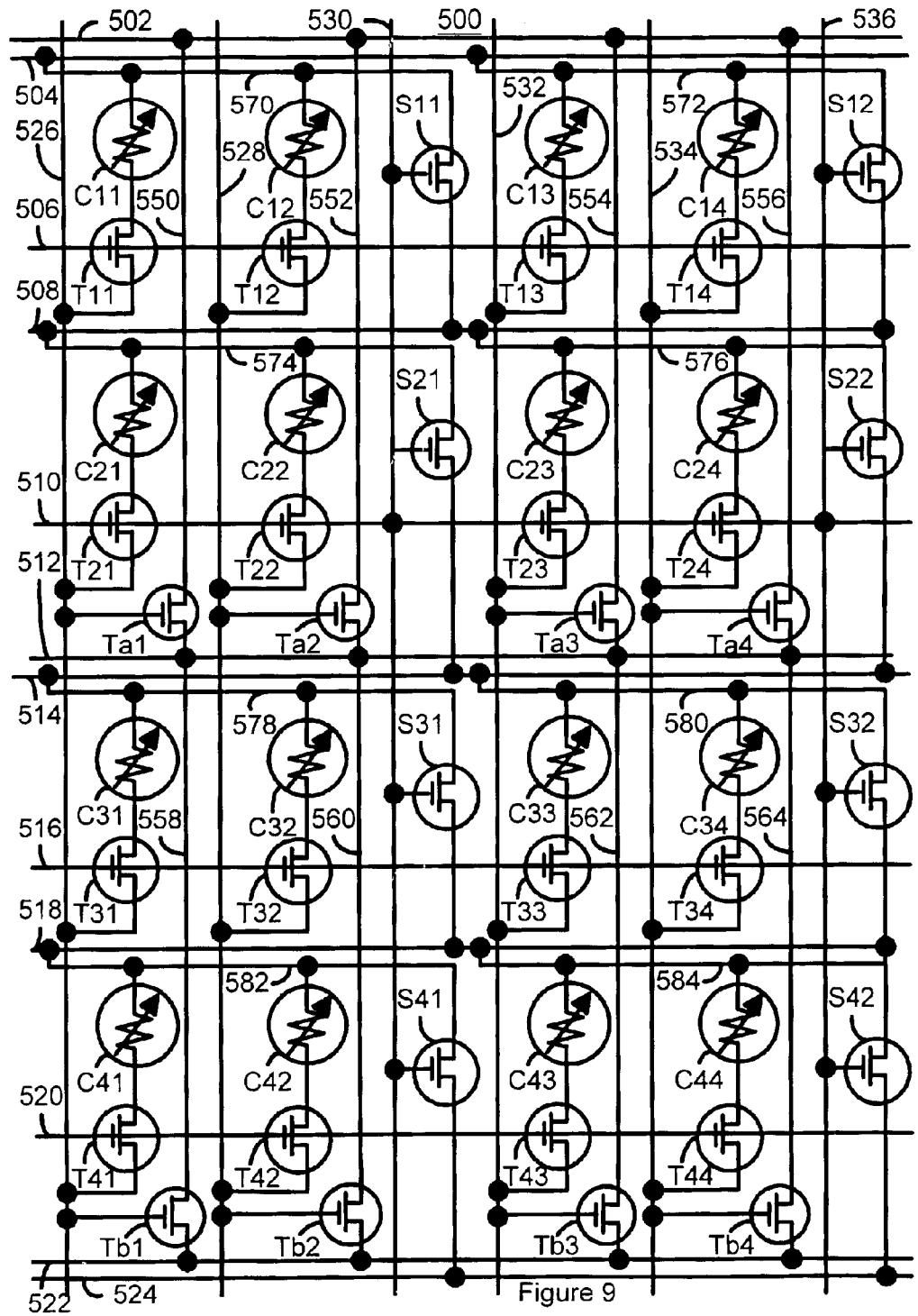
FIG. 9 is a schematic diagram illustrating a fifth embodiment of a portion of an MRAM in accordance with the present invention.

FIG. 9 is a schematic diagram illustrating a fifth embodiment of a portion of an MRAM 500 in accordance with the present invention. The MRAM 500 includes cells C11, C12, C13, C14, C21, C22, C23, C24, C31, C32, C33, C34, C41, C42, C43, and C44. The cells C11, C12, C13, C14, C21, C22, C23, C24, C31, C32, C33, C34, C41, C42, C43, and C44 preferably include MTJ stacks (not shown) such as the MTJ stacks 90 and 90' depicted in FIGS. 4A and 4B. Thus, the MTJ stacks in the MRAM 500 preferably include magnetic layers 92 (not explicitly shown in FIG. 9) and 94 (not explicitly shown in FIG. 9) separated by an insulating barrier layer 93 (not explicitly shown in FIG. 9). The free layer 94 is separated from the corresponding magnetic bit line segment by the nonmagnetic conductive capping layer 95 (not explicitly shown in FIG. 9). Also in a preferred embodiment, the easy axis of each of the free layers 94 of the MTJ stacks 90 are preferably aligned substantially parallel with the corresponding magnetic write line segment, as depicted in FIG. 4A. Because of the small spacing between the free layer 94 and the corresponding bit line, the magnetization of the free layer is strongly coupled magnetostatically to the corresponding magnetic bit line segment. During writing, a flux closure is formed between the magnetic vectors of the free layer 94 and that of the corresponding magnetic bit line segment. A small current in the corresponding magnetic bit line segment can be used to disturb all MTJ elements in contact with the magnetic write lines. Thus the magnetic write line 82 depicted in FIG. 4A is labeled word line in a conventional sense, that all MTJ elements associated with the word line can be addressed simultaneously. Referring back to FIG. 9, the MRAM 500 also includes transistors T11, T12, T13, T14, T21, T22, T23, T24, T31, T32, T33, T34, T41, T42, T43, and T44; as well as selection devices Ta1, Ta2, Ta3, Ta4, Tb1, Tb2, Tb3, Tb4, S11, S12, S21, S22, S31, S32, S41, and S42 that are preferably transistors. In an alternate embodiment, the selection devices could be diodes.

The MRAM 500 includes segmented magnetic bit lines and/or segmented magnetic word lines. In addition, the MRAM 500 includes magnetic bit line segments 550, 552, 554, 556, 558, 560, 562, and 564 and magnetic word line segments 570, 572, 574, 576, 578, 580, 582, and 584. However, the global word lines 504, 508, 514, and 518; the global read word lines 506, 510, 516, and 522; the global read bit lines 526, 528, 532, and 534; the global bit lines 502, 512, and 522; and the bit partition lines 530, and 536 are preferably nonmagnetic, high conductivity material(s) such as copper.

The word line segments 570, 572, 574, 576, 578, 580, 582, and 584 preferably include a conductive soft magnetic material. In one embodiment, one or more of the word line segments 570, 572, 574, 576, 578, 580, 582, and 584 are completely composed of a conductive soft magnetic material(s). In an alternate embodiment, one or more of the word line segments 570, 572, 574, 576, 578, 580, 582, and 584 include soft magnetic material(s) formed on a high conductivity material, such as copper. Thus, the word line segments 570, 572, 574, 576, 578, 580, 582, and 584 may be analogous to the bit lines 82 and 82' of FIGS. 4A and 4B.

In order to write to the MTJ stacks 90 or 90' in the cells C11, C12, C13, C14, C21, C22, C23, C24, C31, C32, C33, C34, C41, C42, C43, and C44, the desired currents are provided through the appropriate bit line segments 550, 552, 554, 556, 558, 560, 562, and 564 and the appropriate word line segments 570, 572, 574, 576, 578, 580, 582, and 584. For example, writing to cells C33 and C34 is described. The global word line 514 and global word line 518 are coupled with a word line current source (not shown) and word line current sink, respectively. An enable voltage is provided to the bit partition line 536, which enables the transistor S32 (as well as transistors S12, S22, and S42). As a result, the word line current flows through the magnetic word lines segment 580 and can be used to write to the cells C33 and C34.

The bit line current and polarity determines the logical state of the cells C33 and C34. To provide the bit line current, the global bit line 512 is coupled with a bit line current source (not shown) while the global bit line 522 is coupled with a bit line current sink (not shown), or vice versa. To allow the flow of current through the appropriate magnetic bit line segments 562 and 564, an enable voltage is provided via read bit line 532 and 534, which turns on transistors Ta3 and Tb3. Consequently, the currents flow through the magnetic bit line segment 562 and the magnetic word line segment 580, allowing the cell C33 to be written. The cell C34 is written in a similar manner. However, instead of utilizing read bit line 532, read bit line 534 is used to turn transistors Ta4 and Tb4. However, because cells C33 and C34 share global bit lines 512 and 522 for writing, these cells are written at different times to ensure that the desired bit line current is used for each cell. In general, where there are many bits associated with one magnetic word line segment 570, 572, 574, 576, 578, 580, 582, or 584, at least two steps are used in writing a word. First writing all the bits with the state "1", and then all the bits with the state "0". The driver circuit would be either a voltage source or a programmable current source.

To read the data stored in the cells C33 and C34, the global word line 514 is coupled to ground and an enable signal is provided to the read word line 516. Consequently, the cells C33 and C34 are coupled to read bit lines 532 and 534, respectively. A read current is provided over the read bit lines 532 and 534. The voltage of these read bit liens 532 and 534 can be measured to determine the data stored in the cells C33 and C34.

Thus, the MRAM 500 shares many of the benefits of the MRAMs 100, 200, 300, and 400. Using the MRAM 500, therefore, thinner bit line segments 550, 552, 554, 556, 558, 560, 562, and 564 and thinner word line segments 570, 572, 574, 576, 578, 580, 582, and 584 can be provided. Moreover, the global bit lines 502, 512, and 522; the global word lines 504, 508, 514, 518, and 524; as well as other global lines 506, 516, 520, 526, 528, 530, 532, 534, and 536 can be made thicker, as well as using higher conductivity materials. Consequently, the benefits of thinner word and bit lines can be achieved without sacrificing performance due to high resistivity of thinner lines. In addition, in the architecture depicted in FIG. 9, the global word lines 504, 508, 514, 518, and 524 and the read word lines 506, 510, 516, and 520 are parallel to the global bit lines 502, 512, and 522. Consequently, these structures 502, 504, 506, 508, 510, 512, 514, 516, 518, 520, 522, and 524 may be fabricated on the same layer, further reducing the cost of fabricating the MRAM 500. In addition, the bit line segments 550, 552, 554, 556, 558, 560, 562, and 564 and word line segments 570, 572, 574, 576, 578, 580, 582, and 584 are made in part or completely of soft magnetic materials. As a result, an even more efficient writing architecture can be achieved. As a result, performance of the MRAM 100 can be enhanced while simplifying processing and reducing cost.

A method and system has been disclosed for providing a magnetic random access memory having improved writing margin and more efficient reading. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic random access memory array comprising:
   a plurality of magnetic storage cells;
   a plurality of global word lines;
   a plurality of word line segments, each of the plurality of word line segments being coupled with at least one of the plurality of global word lines such that the plurality of word line segments is selectable, each of the plurality of word line segments being coupled to a first portion of the plurality of magnetic storage cells;
   a plurality of global bit lines;
   a plurality of bit line segments, each of the plurality of bit line segments being coupled with at least one of the plurality of global bit lines such the plurality of bit line segments is selectable, each of the plurality of bit line segments residing in proximity to a second portion of the plurality of magnetic storage cells to write to the second portion of the plurality of magnetic storage cells; and
   a plurality of selection devices, the plurality of bit line segments and the plurality of word line segments being coupled with and selectable using the plurality of selection devices.

2. The magnetic random access memory array of claim 1 wherein the plurality of global bit lines is substantially parallel to the plurality of global word lines.

3. The magnetic random access memory array of claim 1 further comprising:
   at least one global word line return coupled with at least one of the plurality of global word lines through at least one selection device.

4. The magnetic random access memory array of claim 3 wherein the at least one global word line return further includes a plurality of global word line returns.

5. The magnetic random access memory array of claim 4 wherein each of the plurality of global word line returns corresponds to one of the plurality of global word lines.

6. The magnetic random access memory array of claim 1 further comprising:
   at least one global bit line return coupled with at least one of the plurality of global bit lines through at least one of the plurality of selection devices.

7. The magnetic random access memory array of claim 6 wherein the at least one global bit line return further includes a plurality of global bit line returns.

8. The magnetic random access memory array of claim 7 wherein each of the plurality of global bit line returns corresponds to one of the plurality of global bit lines.

9. The magnetic random access memory array of claim 1 wherein at least a portion of the plurality of word line segments is magnetic.

10. The magnetic random access memory array of claim 1 wherein at least a portion of the plurality of bit line segments is magnetic.

11. The magnetic random access memory array of claim 1 wherein the plurality of global bit lines have a lower resistance than the plurality of bit line segments.

12. The magnetic random access memory array of claim 1 wherein the plurality of global word lines have a lower resistance than the plurality of word line segments.

13. The magnetic random access memory array of claim 12 wherein each of the plurality of global word line segments has a thickness and a width, the thickness being less than the width.

14. The magnetic random access memory array of claim 13 wherein the thickness is less than or equal to one fourth of the width.

15. The magnetic random access memory array of claim 1 wherein the plurality of global bit lines and the plurality of global word lines are both manufactured on a particular metal layer.

16. The magnetic random access memory array of claim 1 wherein the plurality of selection devices include a plurality of transistors or a plurality of diodes.

17. The magnetic random access memory array of claim 1 wherein each of the plurality of magnetic storage cells includes a magnetic tunneling junction including a free layer, a barrier layer, and a pinned layer, the plurality of word line segments being magnetically coupled with the free layer in each of the first portion of the magnetic storage cells.

18. A method of providing a magnetic random access memory array comprising:
   (a) providing a plurality of magnetic storage cells;
   (b) providing a plurality of global word lines;
   (c) providing a plurality of word line segments, each of the plurality of word line segments being coupled with at least one of the plurality of global word lines such that the plurality of word line segments is selectable, each of the plurality of word line segments being coupled to a first portion of the plurality of magnetic storage cells;
   (d) providing a plurality of global bit lines;
   (e) providing a plurality of bit line segments, each of the plurality of bit line segments being coupled with at least one of the plurality of global bit lines such the plurality of bit line segments is selectable, each of the plurality of bit line segments residing in proximity to a second portion of the plurality of magnetic storage cells to write to the second portion of the plurality of magnetic storage cells; and
   (f) providing a plurality of selection devices, the plurality of bit line segments and the plurality of word line segments being coupled with and selectable using the plurality of selection devices.

* * * * *